United States Patent
Ong et al.

(10) Patent No.: US 12,444,685 B2
(45) Date of Patent: Oct. 14, 2025

(54) BACKSIDE ELECTRICAL CONTACT FOR PMOS EPITAXIAL VOLTAGE SUPPLY

(71) Applicant: Intel Corporation, Santa Clara, CA (US)

(72) Inventors: Clifford Ong, Portland, OR (US); Zheng Guo, Portland, OR (US); Eirc A. Karl, Portland, OR (US); Smita Shridharan, Beaverton, OR (US); Mauro J. Kobrinsky, Portland, OR (US); Shem O. Ogadhoh, Beaverton, OR (US); Clifford J. Engel, Hillsboro, OR (US); Charles H. Wallace, Portland, OR (US); Leonard P. Guler, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 686 days.

(21) Appl. No.: 17/710,867

(22) Filed: Mar. 31, 2022

(65) Prior Publication Data

US 2023/0317612 A1    Oct. 5, 2023

(51) Int. Cl.
*H10D 84/85*    (2025.01)
*H01L 23/522*    (2006.01)
*H01L 23/528*    (2006.01)
*H10B 10/00*    (2023.01)

(52) U.S. Cl.
CPC ...... *H01L 23/5286* (2013.01); *H01L 23/5226* (2013.01); *H01L 23/5283* (2013.01); *H10B 10/12* (2023.02); *H10B 10/125* (2023.02); *H10D 84/85* (2025.01); *H10D 84/853* (2025.01)

(58) Field of Classification Search
CPC ........... H10D 84/0193; H10D 84/0186; H10D 84/038; H01L 23/481
See application file for complete search history.

(56) References Cited

U.S. PATENT DOCUMENTS

2022/0336325 A1 *  10/2022  Lai ...................... H01L 23/5286

* cited by examiner

*Primary Examiner* — Fernando L Toledo
*Assistant Examiner* — Adam S Bowen
(74) *Attorney, Agent, or Firm* — Schwabe, Williamson & Wyatt P.C.

(57) ABSTRACT

Embodiments described herein may be related to apparatuses, processes, systems, and techniques directed to electrical couplings between epitaxial structures and voltage sources within transistors in SRAM bit cells. Embodiments include direct electrical couplings between a backside contact metal (BM0) and a backside of an epitaxial structure to provide SRAM VCC voltage (SVCC) voltage, as well as electrical connection structures that electrically couple the BM0 to a front side of an epitaxial structure to provide SVCC voltage. Other embodiments may be described and/or claimed.

25 Claims, 15 Drawing Sheets

BACKSIDE ELECTRICAL CONTACT FOR PMOS EPITAXIAL VOLTAGE SUPPLY

FIELD

Embodiments of the present disclosure generally relate to the field of semiconductor packaging, and in particular to static random-access memory (SRAM) with epitaxial layers electrically coupled with a backside contact metal.

BACKGROUND

Continued growth in virtual machines, cloud computing, and portable devices will continue to increase the demand for high density transistors within chips and packages.

DETAILED DESCRIPTION

Figure 1A:
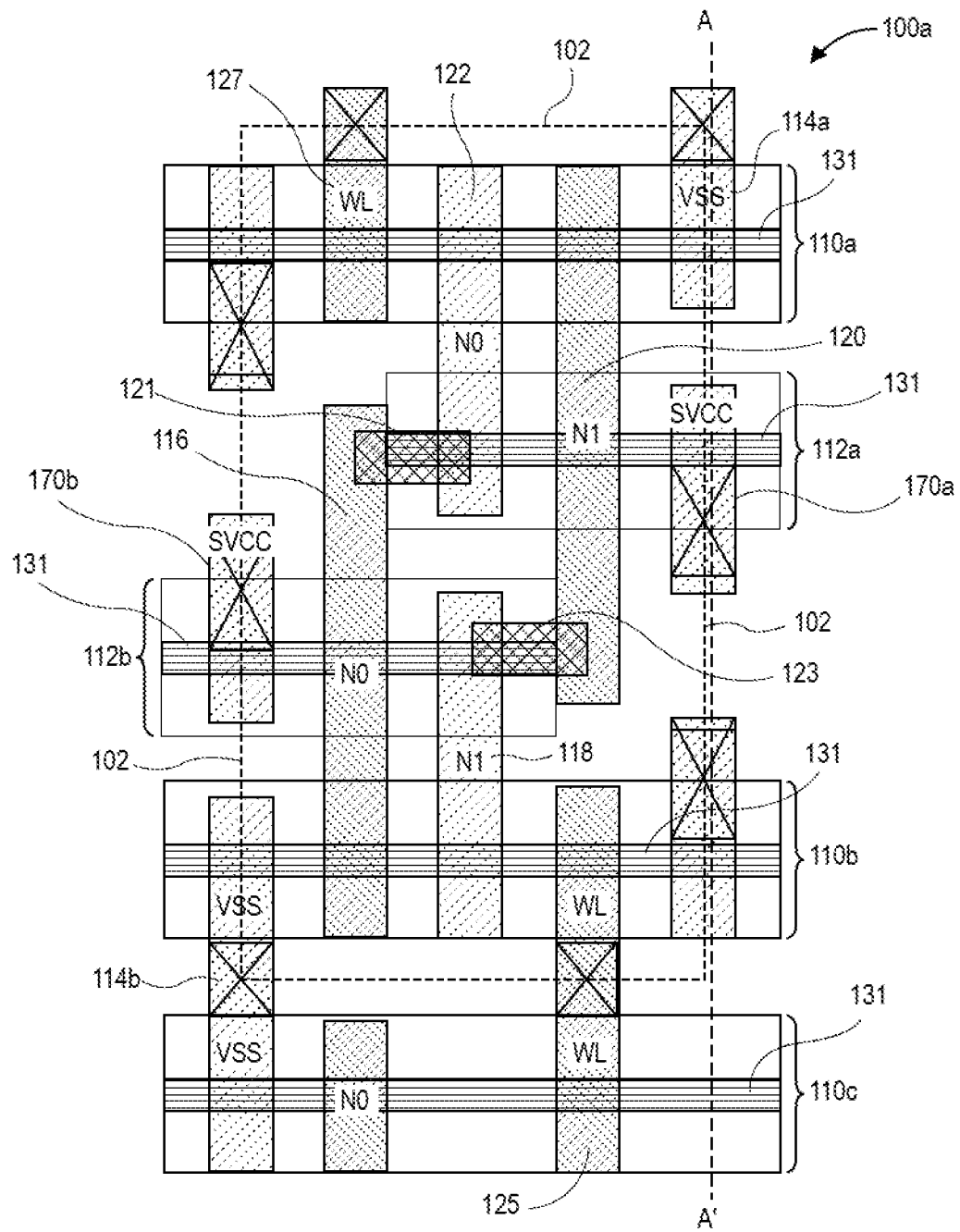
FIGS. 1A-1C show a top-down view and a cross-section side view of a legacy SRAM cell that includes six transistors and that is next to a portion of another SRAM cell.

Embodiments described herein may be related to apparatuses, processes, systems, and techniques directed to electrical couplings between epitaxial structures and voltage sources within SRAM bit cells, which may also be referred to as an SRAM cell. Epitaxial structures are components of transistors that are used to form the source and drain terminals and are included in larger structures, such as inverters, within an SRAM cell. Embodiments may include electrical couplings and/or direct electrical couplings between a backside contact metal (BM0) of a transistor at or near a wafer and a backside of an epitaxial structure within a transistor. Embodiments may also include electrical connection structures that electrically couple the BM0 to a front side of an epitaxial structure. Embodiments provide these electrical couplings to electrically connect a PMOS epitaxial structure with a voltage supply rail (SVCC), and an NMOS epitaxial structure with a voltage ground (VSS), where these electrical couplings minimize a distance between the SRAM voltage supply rail and the various PMOS epitaxial structures and between SRAM voltage ground and the various NMOS epitaxial structures. Embodiments also include electrical connection structures that electrically couple the BM0 to a front side or a back side of a PMOS epitaxial structure, where the BM0 includes an SVCC source.

In embodiments, the resulting shorter electrical conductivity distance between the BM0, or a backside contact, and the PMOS epitaxial structure may significantly reduce the amount of front side transistor electrical connections required in legacy implementations to provide SVCC to PMOS epitaxial structures. These legacy front side electrical connections typically route in one or more front side metal layers such as but not limited to metal layer 0 (M0), metal layer 2 (M2), and/or metal layer 4 (M4). Multiple metal layers may be used in legacy implementations to lower the effective resistance of providing SVCC. Legacy implementations may use a deep boundary via (DVB) ring around an array of SRAM bit cells to provide SVCC power to PMOS epitaxial structures through the front side legacy electrical connections or a combination of metal layer 0 to metal layer 4 routing from an active circuit such as transient voltage collapse (TVC) circuit to provide SVCC power to the SRAM bit cells.

These legacy implementations, in addition to consuming multiple front side metal layer resources, also create a resistive voltage drop to the respective bit cells. In addition, legacy implementations create metal structures that may be inefficient from a routing resource perspective, and increase word line and bit line capacitance. To reduce word line resistance, SRAM designs may use wide metal widths. Customarily, the word line metal 0 tracks on the upper and lower parts of the bitcell are on opposite sides, i.e., left and right sides, of the bit cell. To accommodate SVCC and VSS segments in metal 1, the word line metal 1 routing must be made narrower than desired or made wider but requires additional process capability to support non-straight metal 1 segments. In the latter case, a first word line metal 1 segment connects to the word line metal 0 route on one side in the upper part of the bit cell, and a second word line metal 1 segment connects to the word line metal 0 on the opposite side in the lower part of the bit cell, where both first and second word line metal 1 segments are offset from each other but overlap to electrically connect together, resulting in a serpentine metal 1 routing.

Embodiments described herein provide a more direct electrical path from the PMOS epitaxial structure to SVCC source and from the NMOS epitaxial structure to VSS, in comparison to legacy implementations. Embodiments may reduce the number of front side electrical connections required in legacy implementations as described above, and also reduce the resistance on the SVCC source, eliminate SVCC and VSS tracks on metal 0 and above, reduce the coupling capacitance on the word line in metal 0 and above, reduce coupling capacitance on the bit metal 0 and above, thereby increase the SRAM bit cell read current ($I_{READ}$), a key SRAM metric that directly influences the speed of the SRAM read operation and therefore, improve overall SRAM performance.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

Figure 1B:
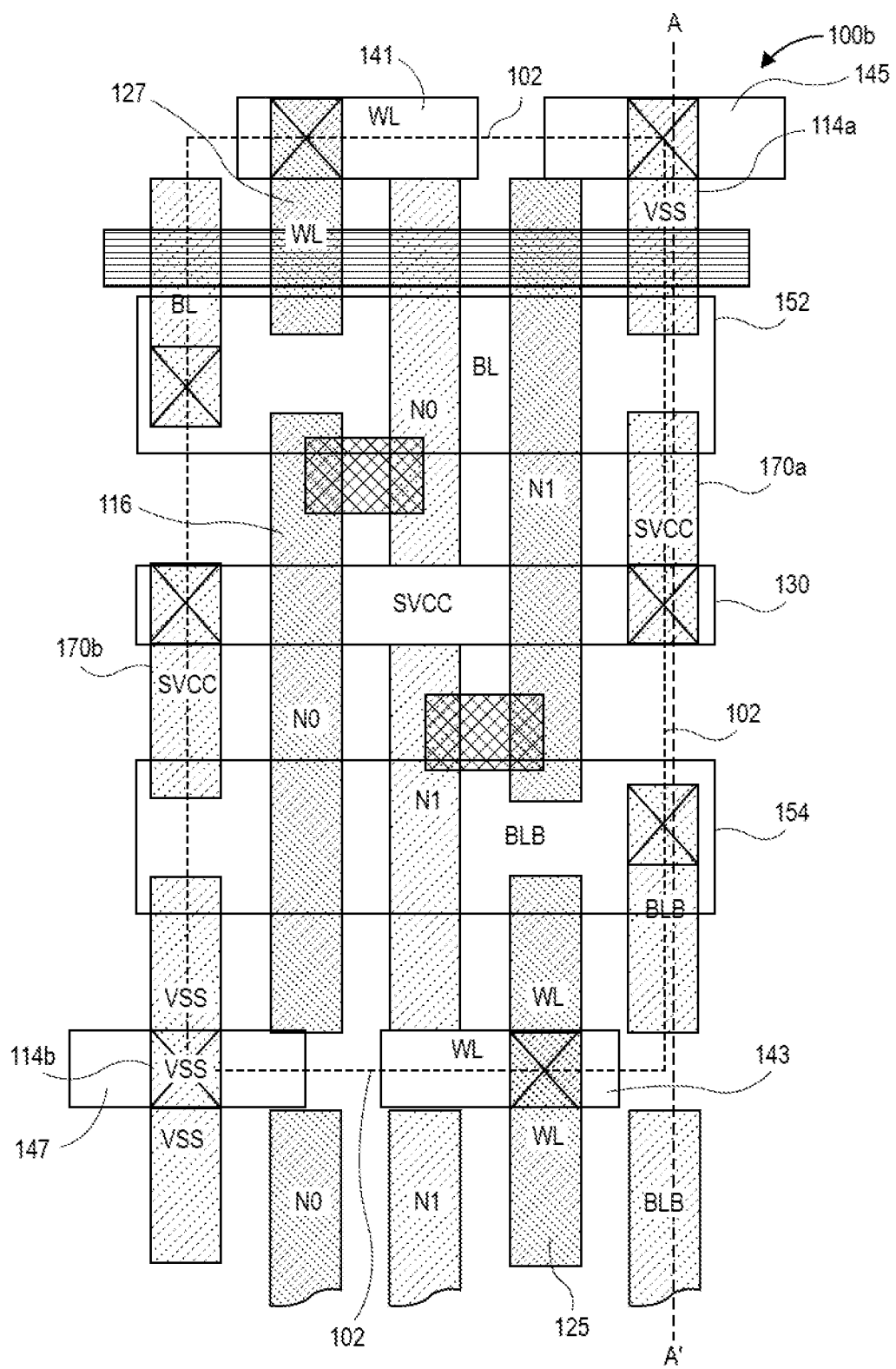
Figure 1C:
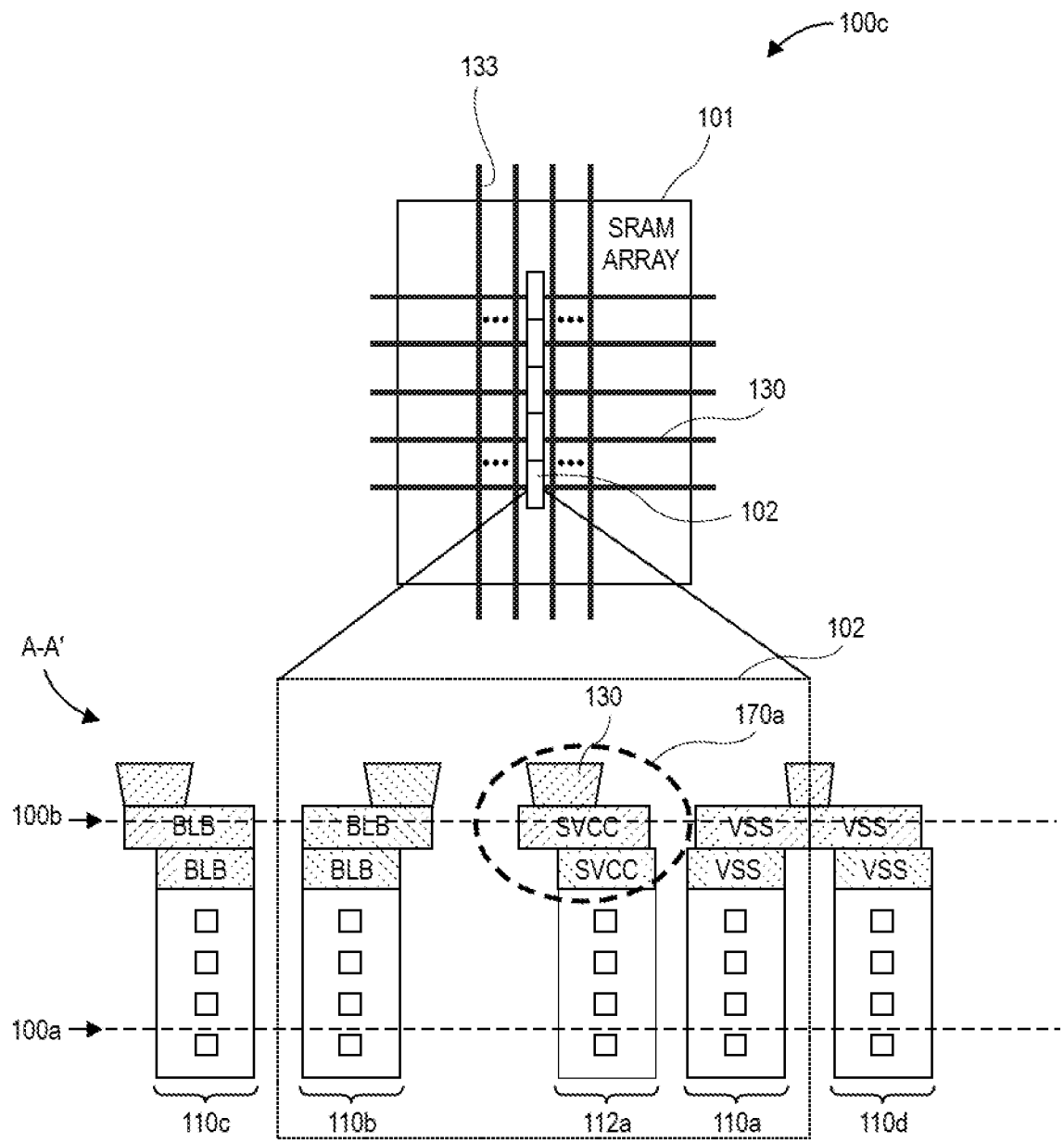

FIGS. 1A-1C show a top-down view and a cross-section side view of a legacy SRAM cell that includes six transistors and that is next to a portion of another SRAM cell. Diagram 100a of FIG. 1A and diagram 100b of FIG. 1B show a top-down cross-section view of a legacy SRAM cell 102, at different layers 100a, 100b as shown in diagram 100c of FIG. 1C. Diagram 100a shows base layers, and diagram 100b shows the metal 0 (M0) layer.

FIG. 1A includes diagram 100a that shows a top-down view of a legacy SRAM cell 102 that includes NMOS epitaxial layers 110a, 110b and PMOS epitaxial layers 112a, 112b. In legacy implementations, VSS connection 114a provides a ground connection to the NMOS epitaxial layer 110a, and VSS connection 114b provides a ground connection to the NMOS epitaxial layer 110b and 110c. Note that the NMOS epitaxial layer 110c is in a different SRAM cell than SRAM cell 102, but shares a same VSS connection 114b with SRAM cell 102. Various nanoribbons or FIN-FETS 131 are shown in the various epitaxial layers 110a, 110b, 110c, 112a, 112b.

SVCC connection 170a provides the SRAM VCC (SVCC) voltage connection with PMOS epitaxial layer 112a and SVCC connection 170b provides the SVCC voltage connection with PMOS epitaxial layer 112b. In FIG. 1B, electrical connection 130 electrically couples with the SVCC connection 170a and 170b, and provides a fixed or variable voltage connection along the SVCC epitaxial layer 112a and 112b of FIG. 1A.

In FIG. 1A, the SRAM cell 102 forms a cross-coupled inverter, with a first inverter including a poly gate (N0) 116 as an input and trench contact (N1) 118 as output, a second inverter including a poly gate (N1) 120 as an input and a trench contact (N0) 122 as output, a pair of gate to trench contacts 121, 123 that electrically couple the first inverter output to the second inverter input (N0 116 to N0 122), and the second inverter input to the first inverter output (N1 120 to N1 118), a first poly gate (WL) 127 of the passgate transistor that electrically couples N0 122 with the bitline (BL), and a second poly gate (WL) 125 of the passgate transistor that electrically couples N1 118 with a bitline_bar (BLB).

FIG. 1B includes diagram 100b that shows a cross-section of the SRAM cell 102 at layer 100b as shown in diagram 100c of FIG. 1C, at the front side of the SRAM cell 102. VSS structures 114a, 114b are shown, as well as SVCC structures 170a, 170b that are electrically coupled with a SVCC connector 130. Also shown is bit line 152, and bit line bar 154. This layer also includes the wordline metal 0 layers 141, 143 that control, respectively, the passgates 127, 125 and VSS metal 0 layers 145, 147 that electrically couple, respectively, with VSS trench contacts 114a, 114b.

FIG. 1C includes diagram 100c that shows a top-down schematic of a plurality of SRAM cells that make up SRAM array 101, that includes an SRAM cell 102. The diagram marked A-A' is a cross-section side view of SRAM cell 102 of A-A' in FIG. 1A or FIG. 1B.

The first electrical connection 130, in legacy implementations as referred to above, is implemented across the front side of the SRAM array 101 and electrically couples with the SVCC connection 170a. The SVCC connection 170a is electrically coupled with and provides a variable voltage to the SVCC epitaxial structure 112a. The SVCC connection 170a is sourced from SVCC metal 0 (130 of FIG. 1B) and other upper metal layers depicted by lines 133. Note that NMOS epitaxial layer 110d is in a different SRAM cell than SRAM cell 102. The VSS routing on upper metal layers (metal 0, metal 1, metal 2, etc.) may also be similarly represented by lines 130 and 133 routed across the bit cell array.

Figure 2:
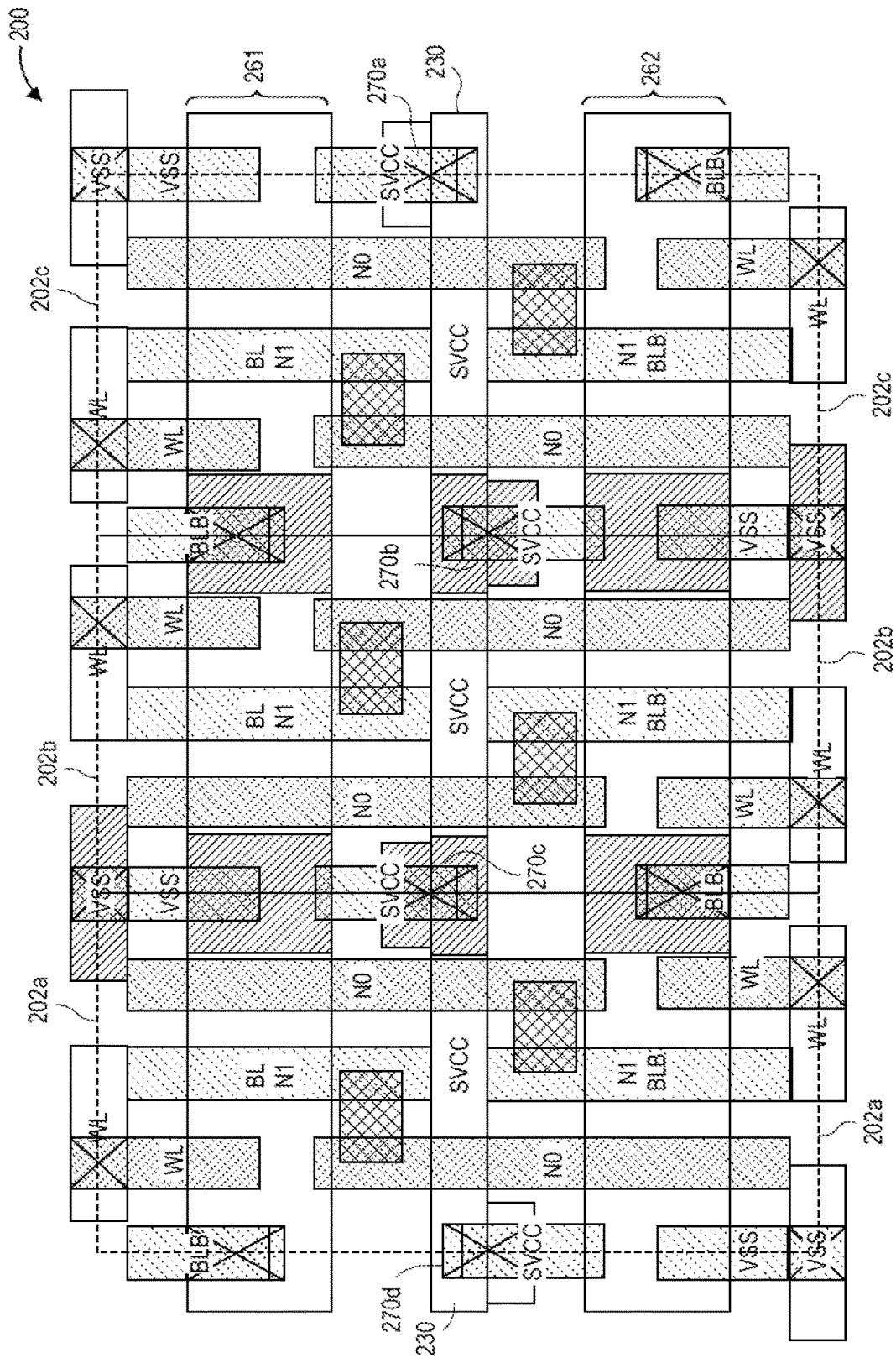
FIG. 2 shows a top-down view of a legacy SRAM array that includes three SRAM cells that share a common SRAM voltage supply (SVCC) rail at the front end of the SRAM array.

FIG. 2 shows a top-down view of a legacy SRAM array that includes three SRAM cells that share a common SVCC bus at the front end of the SRAM array. SRAM array 200 of FIG. 2 shows a legacy implementation of multiple SRAM cells 202a, 202b, 202c, which may be similar to SRAM cell 102 in diagram 100b of FIG. 1B. The SRAM array 200 may be at a cross-section level similar to cross-section level 100b of FIG. 1C, and may include layers of the SRAM above or below the cross-section level.

SVCC electrical connection 230, which may be similar to SVCC first electrical connection 130 of FIG. 1C, may be at an upper layer of the SRAM array 200, for example between the M0 and M4 layers. In implementations, the SVCC electrical connection 230 electrically couples with SVCC structures 270a-270d, which may be similar to SVCC structures 170a, 170b of FIGS. 1A-1C, and provides a fixed or varying voltage to the PMOS epitaxial structures of SRAM cells 202a, 202b, 202c.

The SVCC electrical connection 230 may be electrically coupled with an active circuit, where the voltage of the SVCC electrical connection 230 may be modulated up and down as the SRAM array 200 is accessed. In embodiments, this varying voltage facilitates writing into the SRAM cells 202a, 202b, 202c. For this reason, in implementations, the SVCC electrical connection 230 may be electrically isolated from other SVCC electrical connections (not shown) that electrically couple other PMOS epitaxial structures within the SRAM array 200.

The SVCC electrical connection 230 is between a bit line electrical connector 261, and a bit line bar electrical connector 262. In legacy implementations, a width of the SVCC electrical connection 230 and/or the proximity of the SVCC electrical connection 230 to the bit line electrical connector 261 or the bit line bar electrical connector 262 may cause capacitance issues during operation of the SRAM array 200. In addition, a width of the bit line electrical connector 261 or the bit line bar electrical connector 262 may be narrowed in order to accommodate a width of the SVCC electrical connection 230, which may increase the resistance value in both the bit line electrical connector 261 and the bit line bar electrical connector 262.

Figure 3A:
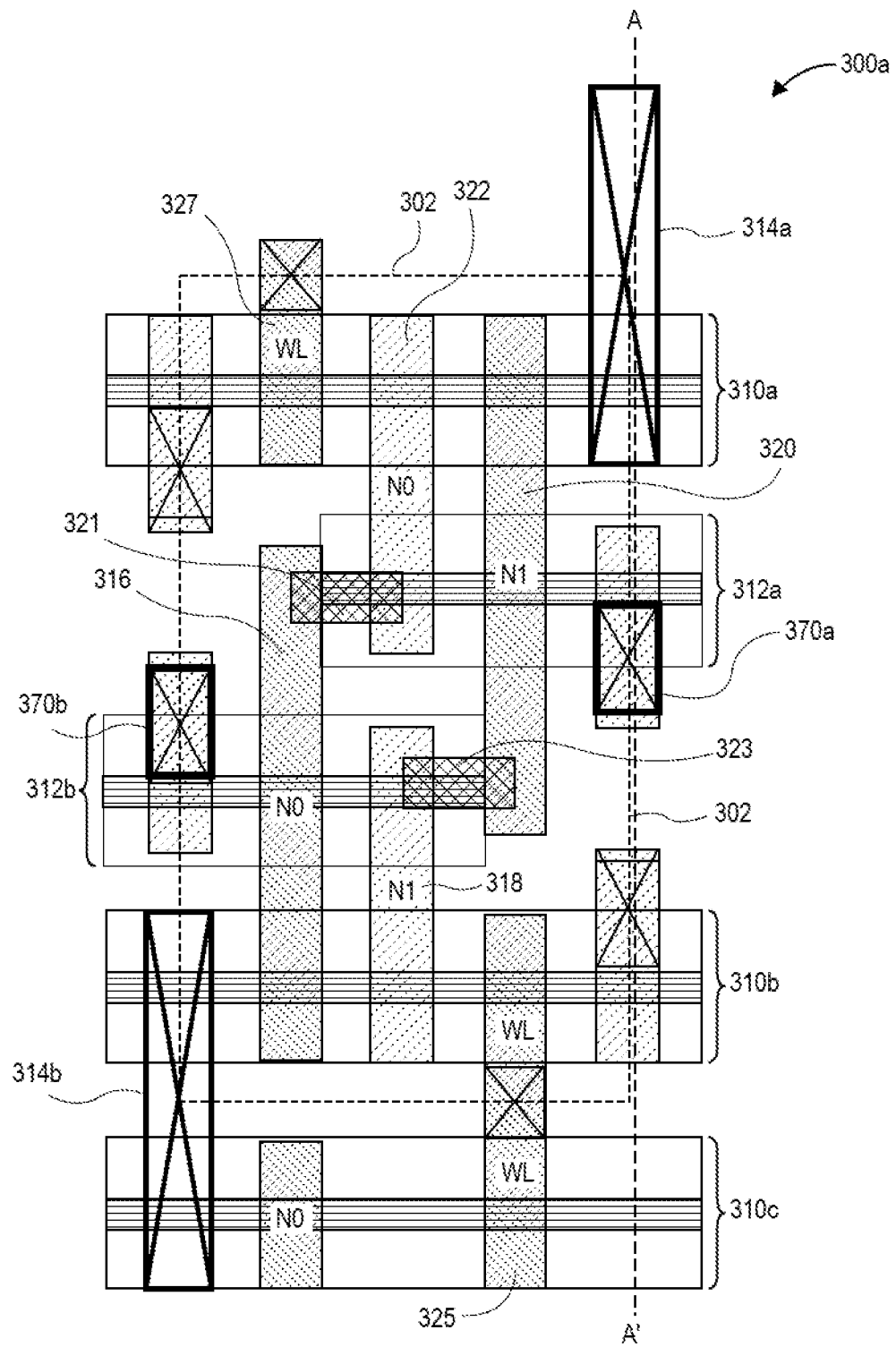
FIG. 3A-3B show a top-down view and a cross section side view of a SRAM cell that includes an NMOS epitaxial layer that is directly electrically coupled with a first backside contact metal to provide a VSS connection and a PMOS epitaxial layer that is directly electrically coupled with a second backside contact metal to provide a SVCC connection, in accordance with various embodiments.
Figure 3B:
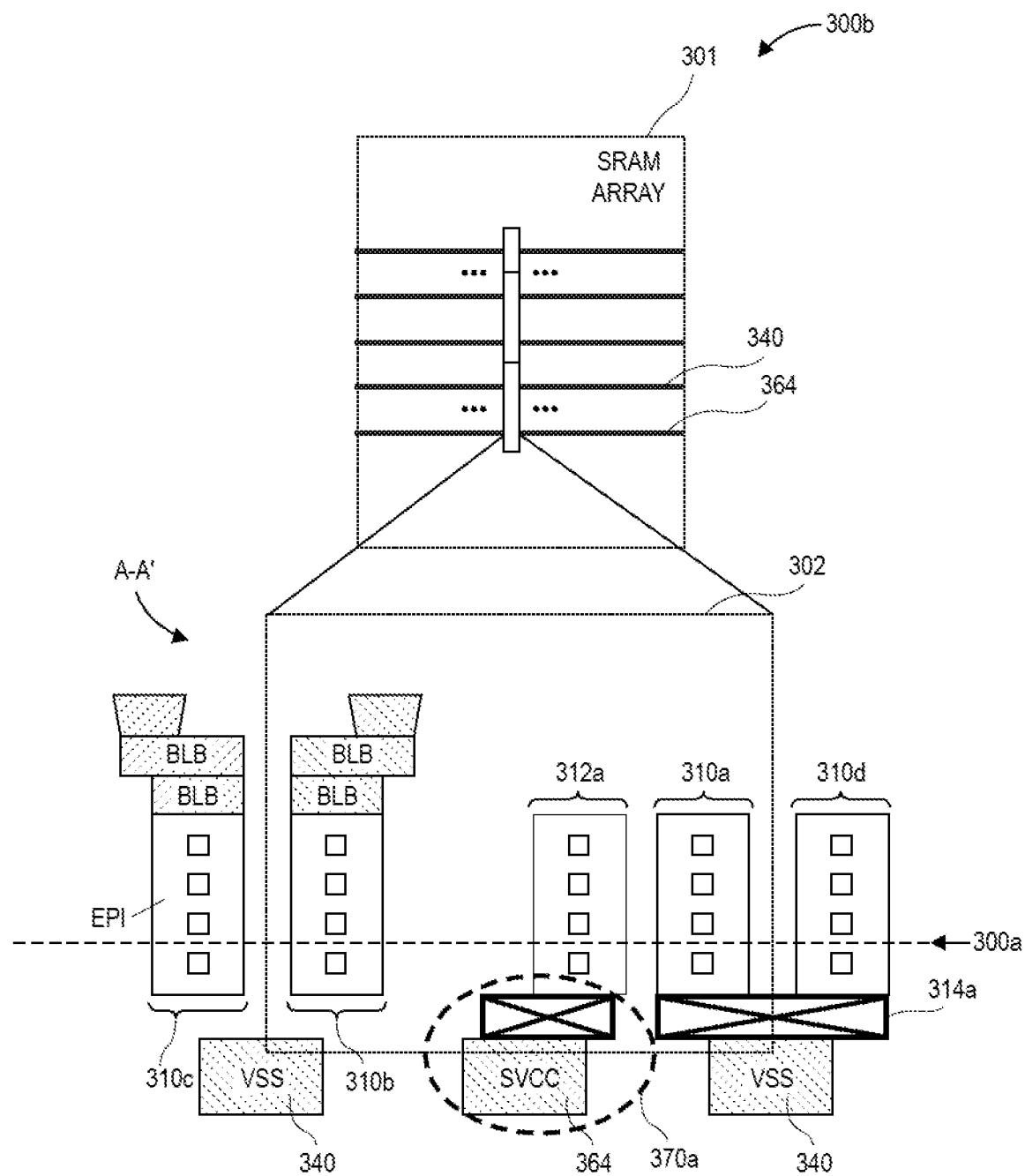

FIG. 3A-3B show a top-down view and a cross section side view of a SRAM cell that includes an NMOS epitaxial layer that is directly electrically coupled with a first backside contact metal to provide a VSS connection and a PMOS epitaxial layer that is directly electrically coupled with a second backside contact metal to provide a SVCC connection, in accordance with various embodiments.

Diagram 300a of FIG. 3A, which may be similar to diagram 100 of FIG. 1A, shows a top-down view of a SRAM cell 302, which may be similar to SRAM cell 102 of FIG. 1A. The SRAM cell 302 includes NMOS epitaxial layers 310a, 310b and PMOS epitaxial layers 312a, 312b, which may be similar to NMOS epitaxial layers 110a, 110b and PMOS epitaxial layers 112a, 112b of FIGS. 1A, 1C. Note that NMOS epitaxial layer 310c is in a different SRAM cell than SRAM cell 302.

VSS connection 314a, which is at a backside of the SRAM cell 302 and below NMOS epitaxial layers 310a, 310b provides an electrical connection with a VSS source 340 shown on FIG. 3B. The VSS connection 314b which is a backside of NMOS epitaxial layers 310b, 310c, provides an electrical connection with the VSS source 340. Note that the NMOS epitaxial layers 310c and 310d are in a different SRAM cell than SRAM cell 302, but are electrically coupled with the SRAM cell 302.

SVCC connection 370a is electrically coupled with and provides a fixed or variable electrical voltage to the PMOS epitaxial structure 312a. SVCC connection 370b is electrically coupled with and provides a fixed or variable electrical voltage to the PMOS epitaxial structure 312b. In embodiments, both the SVCC connection 370a, 370b are electrically coupled with an SVCC source 364 that is below the PMOS epitaxial structures 312a, 312b, as shown in FIG. 3B.

The SRAM cell 302 forms a cross-coupled inverter, with a first inverter including a poly gate (N0) 316 as an input and trench contact (N1) 318 as output, a second inverter including a poly gate (N1) 320 as an input and a trench contact (N0) 322 as output, a pair of gate to trench contacts 321, 323 that electrically couples the first inverter output to the second inverter input (N0 316 to N0 322), and the second inverter input to the first inverter output (N1 320 to N1 318), a first poly gate (WL) 327 of the passgate transistor that electrically couples N0 322 with the bitline (BL), and a second poly gate (WL) 325 of the passgate transistor that electrically couples N1 with the bitline_bar (BLB).

FIG. 3B includes diagram 300b that shows a top-down schematic of a plurality of SRAM cells that make up an SRAM array 301 that includes SRAM cell 302. The lower diagram marked A-A' is a cross-section side view of SRAM cell 302 of FIG. 3A at A-A'.

The VSS source 340, which may also be referred to as VSS reference plane, in embodiments is below the NMOS epitaxial layers 310a-310d. In embodiments, the VSS connections 314a, 314b may be directly electrically coupled with at least some of the NMOS epitaxial layers 310a-310d. In embodiments, the VSS connections 314a, 314b may include an electrically conductive material, which may include a metal such as but not limited to copper, gold, or aluminum, or may also include an electrically conductive metal alloy.

In embodiments, the VSS connections 314a, 314b may be within one or more layers of a trench connector network that may exist at or above the VSS source 340 and below the SRAM array 301. It should also be appreciated that, in other embodiments, structure similar to the VSS connections 314a, 314b may be used to provide power or ground to other components within the SRAM array 301.

The SVCC source 364, which may be unique for each bit cell column or common across all bit cell columns, in embodiments is below the PMOS epitaxial layers 312a, 312b. Note that PMOS epitaxial layer 312b is at a different plane than is shown in A-A'. In embodiments, the SVCC connections 370a, 370b may be directly electrically coupled with at least some of the PMOS epitaxial layers 312a, 312b. In embodiments, the SVCC connections 370a, 370b may include an electrically conductive material, which may include a metal such as, but not limited to, copper, gold, or aluminum, or may also include an electrically conductive metal alloy.

In embodiments, the SVCC connections 370a, 370b may be within one or more layers of a trench connector network that may exist at or above the SVCC source 364 and below the PMOS epitaxial structure 312a of SRAM array 301. As discussed above, the SVCC source 364 may carry a fixed or variable voltage.

Figure 4:
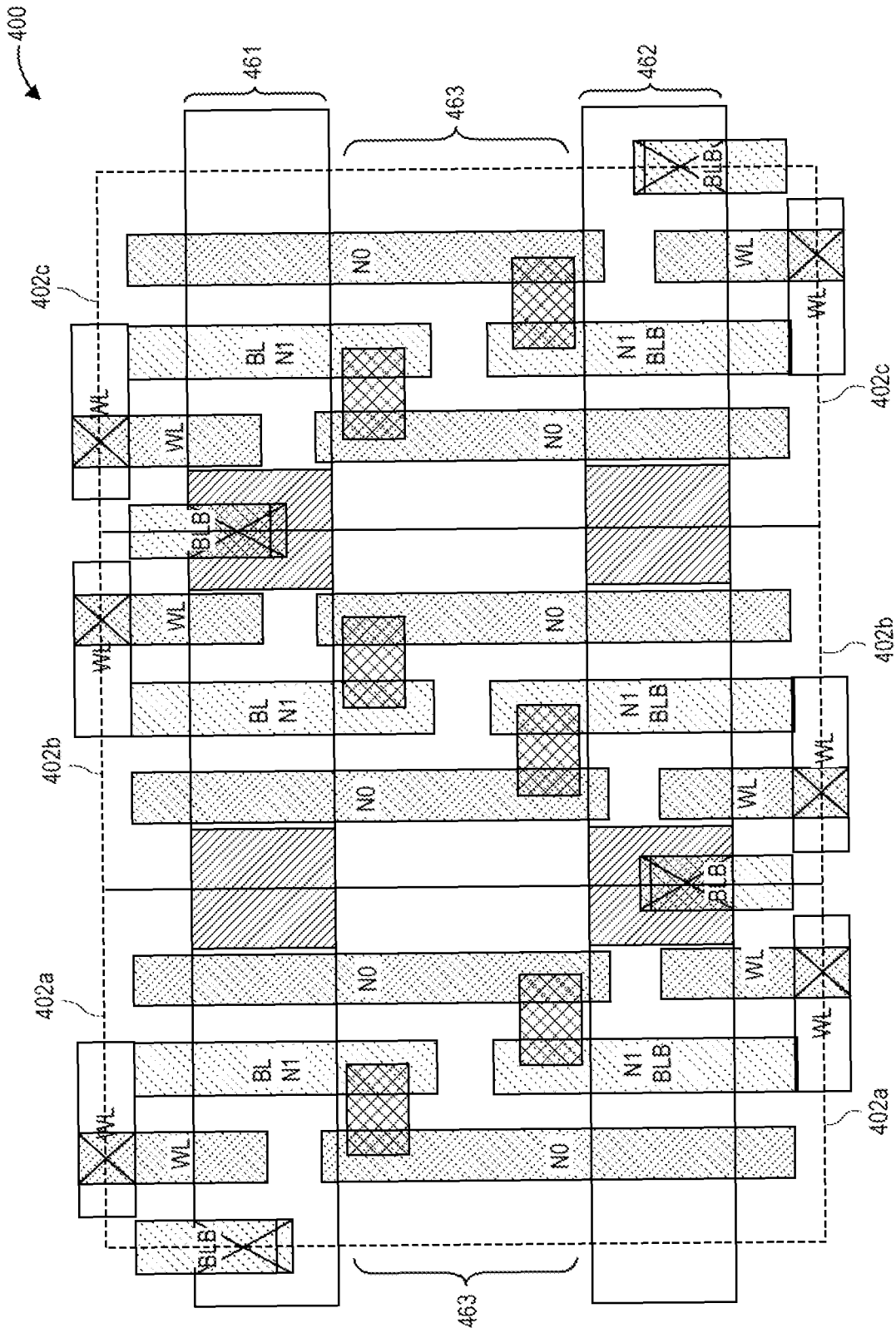
FIG. 4 shows a top-down view of a SRAM array that includes three SRAM cells that share a common SVCC bus at the back end of the SRAM array, in accordance with various embodiments.

FIG. 4 shows a top-down view of a SRAM array that includes three SRAM cells that share a common SVCC bus at the back end of the SRAM array, in accordance with various embodiments. SRAM array 400 shows an embodiment of multiple SRAM cells 402a, 402b, 402c, which may be similar to SRAM cells 202a, 202b, 202c of FIG. 2. The SRAM array 400 is at a cross-section level that may be similar to cross-section level 100b of FIG. 1C, at the front side of the SRAM array 400, and may include layers of the SRAM above or below the cross-section level.

In embodiments, a bit line 461, which may be similar to bit line 261 of FIG. 2, extends across the SRAM array 400 at the upper layers, and may be parallel to a bit line bar 462, which may be similar to bit line bar 262 of FIG. 2. Note that the space 463 between the bit line 461 and the bit line bar 462 at the upper layers of the SRAM array 400 does not include any SVCC routing. In embodiments, SVCC circuitry is now at the bottom of the SRAM array 400. In particular, in embodiments, the SVCC electrical connection 230, as well as the SVCC structures 270a-270d of FIG. 2 are no longer needed.

As a result, a width of the bit line 461 and/or a width of the bit line bar 462 may now be widened to reduce their electrical resistance. In addition, the distance between the bit line 461 and the bit line bar 462, may be varied to optimize the resistance and capacitance of the bit lines.

Figure 5A:
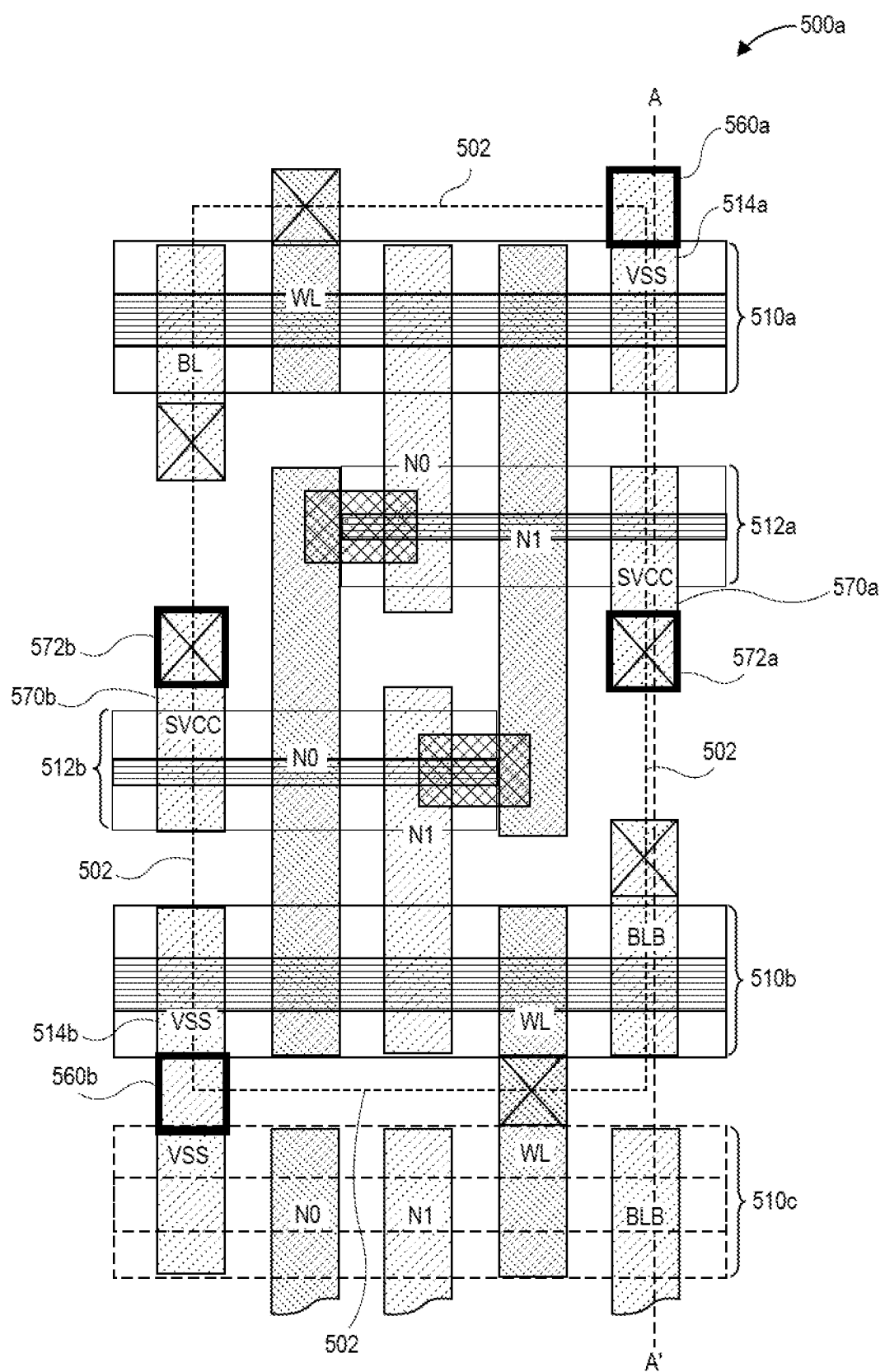
FIGS. 5A-5C show multiple top-down views and a cross section side view of an SRAM cell that includes a deep trench connector to electrically couple the top of a PMOS epitaxial layer with a backside contact metal, in accordance with various embodiments.
Figure 5B:
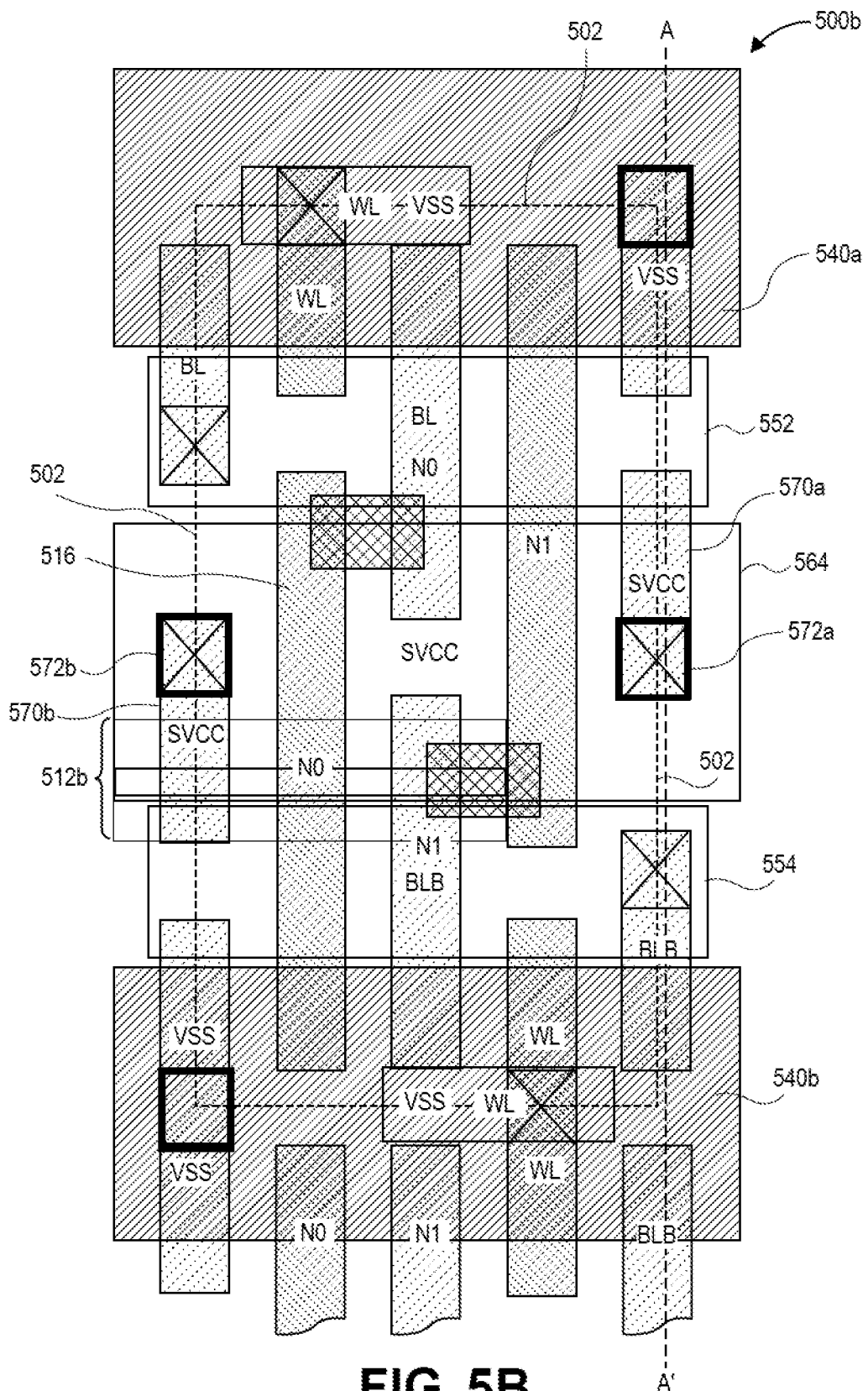
Figure 5C:
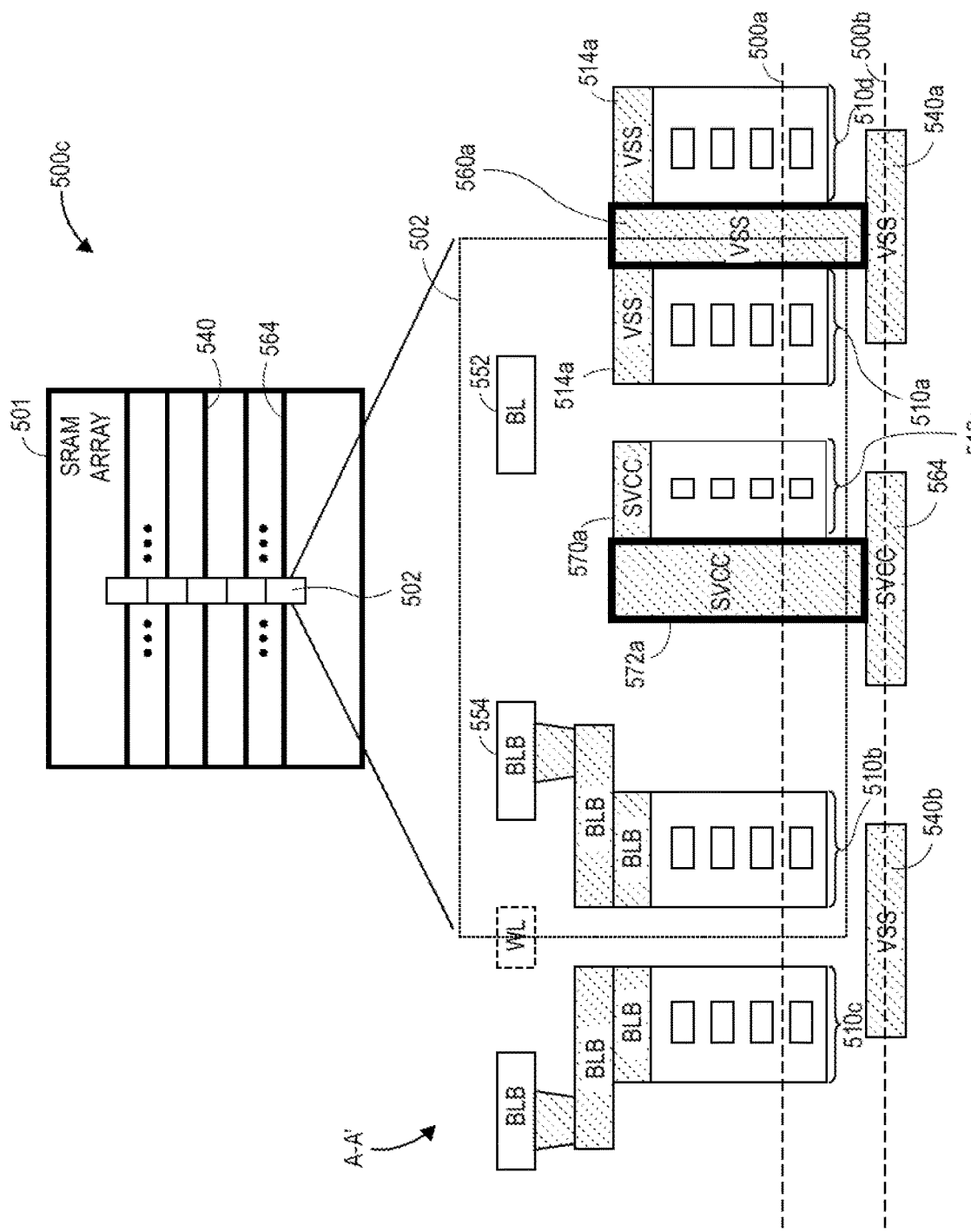

FIGS. 5A-5C show multiple top-down views and a cross section side view of an SRAM cell that includes a deep trench connector to electrically couple the top of a PMOS epitaxial layer with a backside contact metal, in accordance with various embodiments.

FIGS. 5A-5B show multiple top-down views of an SRAM cell that includes a deep trench connector to electrically couple the top of an epitaxial layer with a backside contact metal, in accordance with various embodiments. Diagrams 500a, 500b show a top-down view of embodiments of a SRAM cell 502 at different layers 500a, 500b as shown in diagram 500c of FIG. 5C. Diagram 500a includes NMOS epitaxial layers 510a, 510b, which may be similar to NMOS epitaxial layers 110a, 110b of FIG. 1A, and also includes PMOS epitaxial layers 512a, 512b, which may be similar to epitaxial layers 112a, 112b of FIG. 1A. The SRAM cell 502 forms a cross-coupled inverter, which is similar to SRAM cell 102 of FIGS. 1A-1B as described above. Note that NMOS epitaxial layer 510c is in a different SRAM cell than SRAM cell 502.

In embodiments, SVCC connection 570a provides an electrical connection to the PMOS epitaxial layer 512a, and SVCC connection 570b provides an electrical connection to the PMOS epitaxial layers 512b. In embodiments, SVCC deep trench connector 572a extends from SVCC connection 570a down through the SRAM cell 502 to a SVCC reference plane or source 564, shown in FIGS. 5B-5C. Deep trench connector 572b extends from SVCC connection 570b to SVCC reference plane or source 564, and electrically couples the SVCC connection 570b with the SVCC reference plane or source 564. In embodiments, the deep trench connectors 572a, 572b may be created by using an etch process to create a via or hole that is subsequently filled with an electrically conductive material, such as a metal.

FIG. 5B includes diagram 500b that shows a top-down view of the SRAM cell 502 at layer 500b as shown in diagram 500c of FIG. 5C. SVCC structure 570a is electrically coupled with deep trench connector 572a, and SVCC structure 570b is electrically coupled with deep trench connector 572b. Note that the deep trench connectors 572a, 572b extend through the plane shown in diagram 500b, and extend to a SVCC reference plane 564 that may be below the SVCC epitaxial structures 512a, 512b (as shown in FIG. 5A) at the bottom of the SRAM cell 502. The VSS reference planes 540a, 540b are shown in diagram 500b for convenience. Bit line 552 and bit line bar 554 are also shown.

FIG. 5C shows a cross section side view of the SRAM cell that includes a deep trench connector to electrically couple the top of an epitaxial layer with a backside contact metal, in accordance with various embodiments. Diagram 500c shows a top-down schematic of a plurality of SRAM cells that make up an SRAM array 501 that includes SRAM cell 502. The lower diagram is a cross section of the cut A-A' of diagrams 500a, 500b. A VSS source 540a, which may also be referred to as VSS reference plane, is shown below the NMOS epitaxial layers 510a-510d. A VSS deep trench connector 560a electrically couples the VSS source 540a through the VSS connector 514a to the NMOS epitaxial structures 510a, 510d. A VSS deep trench connector 560b electrically couples the VSS source 540b through the VSS connector 514b to the NMOS epitaxial structures 510b, 510c (as shown in FIG. 5A).

The SVCC reference plane 564 is shown below the SVCC epitaxial structure 512a. The SVCC deep trench connector 572a electrically couples the SVCC reference plane 564 with the SVCC structure 570a. The SVCC structure 570a is then electrically coupled to the PMOS epitaxial structure 512a. In embodiments, the SVCC reference plane 564 may be part of a backside contact metal for the SRAM cell 502. Note that in embodiments, the sides of the deep trench connector 572a may be adjacent to and/or physically coupled with the PMOS epitaxial layers 512a, 512b. In embodiments, there may be a dielectric or some other layer (not shown) that separates the SVCC reference plane 564 from the bottom of the PMOS epitaxial layers 512a, 512b.

Figure 6:
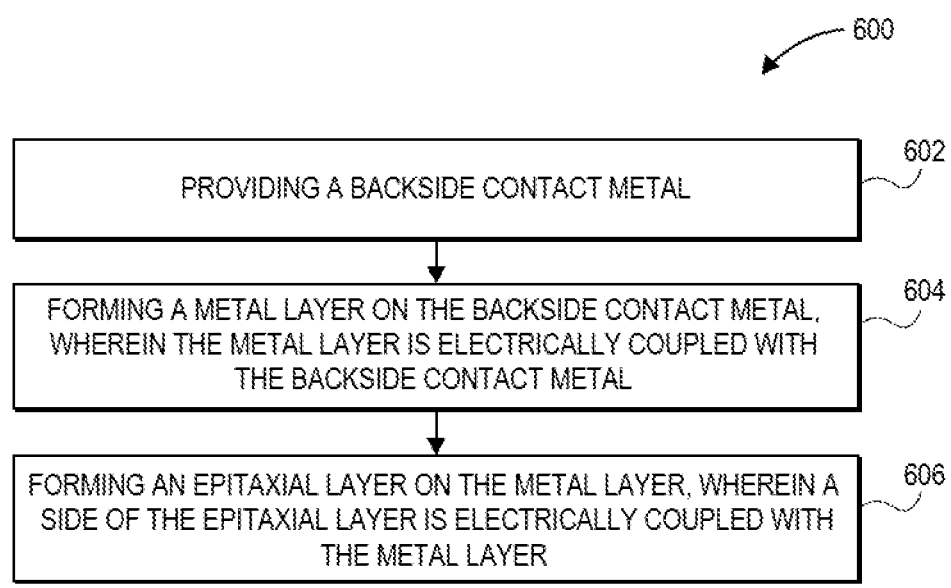
FIG. 6 illustrates an example process for manufacturing an SRAM that includes an epitaxial layer that is electrically coupled with a backside contact metal, in accordance with various embodiments.

FIG. 6 illustrates an example process for manufacturing an SRAM that includes an epitaxial layer that is electrically coupled with a backside contact metal, in accordance with various embodiments. Process 600 may be implemented using the apparatus, techniques, systems, and procedures discussed herein, and in particular with respect to FIGS. 1-5C. In embodiments, the SRAM may be similar to SRAM 302 of FIGS. 3A-3B.

At block 602, the process may include providing a backside contact metal. In embodiments, the backside contact metal may be similar to SVCC 364 of FIG. 3B.

At block 604, the process may further include forming a metal layer on the backside contact metal, wherein the metal layer is electrically coupled with the backside contact metal. In embodiments, the metal layer may be similar to SVCC connection 314a of FIG. 3B.

At block 606, the process may further include forming an epitaxial layer on the metal layer, wherein a side of the epitaxial layer is electrically coupled with the metal layer. In embodiments, the epitaxial layer may be similar to epitaxial layer 312a of FIG. 3B.

Figure 7:
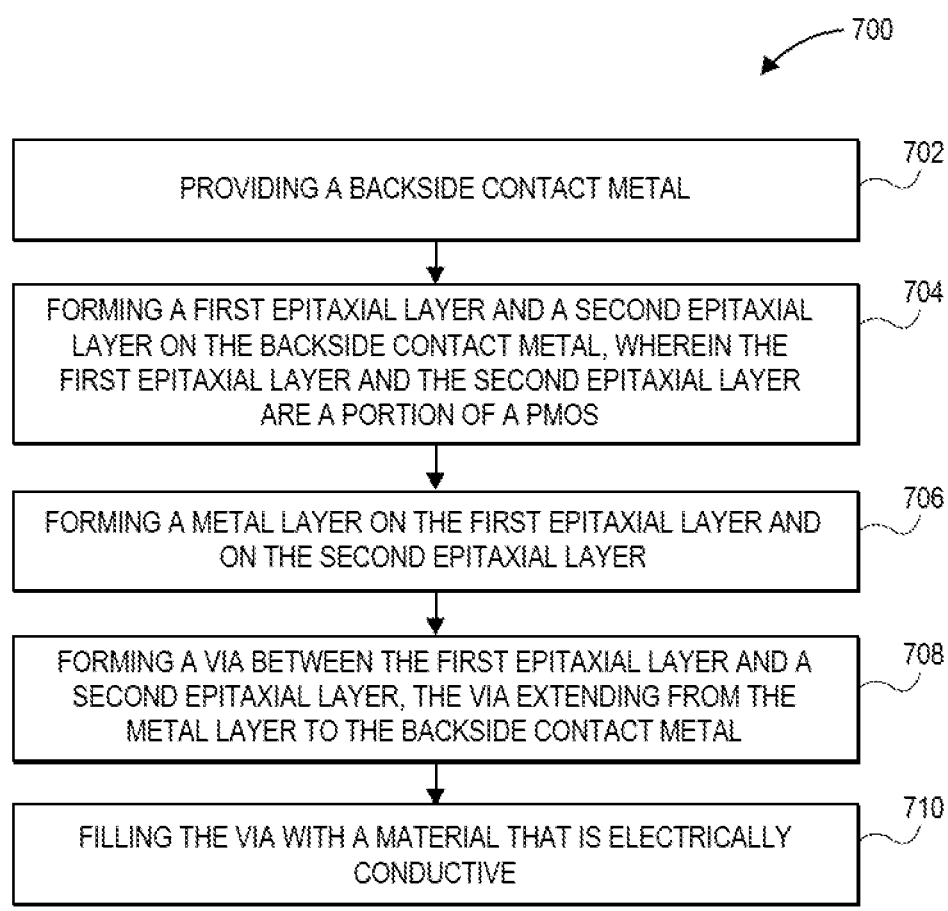
FIG. 7 illustrates an example process for manufacturing an SRAM that includes a PMOS epitaxial layer that is directly electrically coupled with a backside contact metal, in accordance with various embodiments.

FIG. 7 illustrates another example process for manufacturing an SRAM that includes a PMOS epitaxial layer that is directly electrically coupled with a backside contact metal, in accordance with various embodiments. Process 700 may be implemented using the apparatus, techniques, systems, and procedures discussed herein, and in particular with respect to FIGS. 1-5C. In embodiments, the SRAM may be similar to SRAM 502 of FIGS. 5A-5C.

At block 702, the process may include providing a backside contact metal. In embodiments, the backside contact metal may be similar to SVCC source 564 of FIGS. 5A-5C.

At block 704, the process may further include forming a first epitaxial layer and a second epitaxial layer on the backside contact metal, wherein the first epitaxial layer and the second epitaxial layer are a portion of a PMOS. In embodiments, the first epitaxial layer may be similar to epitaxial layer 512a, and the second epitaxial layer may be similar to epitaxial layer 512b of FIGS. 5A-5C.

At block 706, the process may further include forming a metal layer on the first epitaxial layer and on the second epitaxial layer. In embodiments, the metal layer may be similar to SVCC structure 570a of FIG. 5C.

At block 708, the process may further include forming a via between the first epitaxial layer and a second epitaxial layer, the via extending from the metal layer to the backside contact metal. In embodiments, the via may be similar to the via created that includes SVCC deep trench 572a of FIGS. 5A-5C.

At block 710, the process may further include filling the via with a material that is electrically conductive. In embodiments, the material may be similar to the material that is included in SVCC deep trench 572a of FIGS. 5A-5C.

Figure 8A:
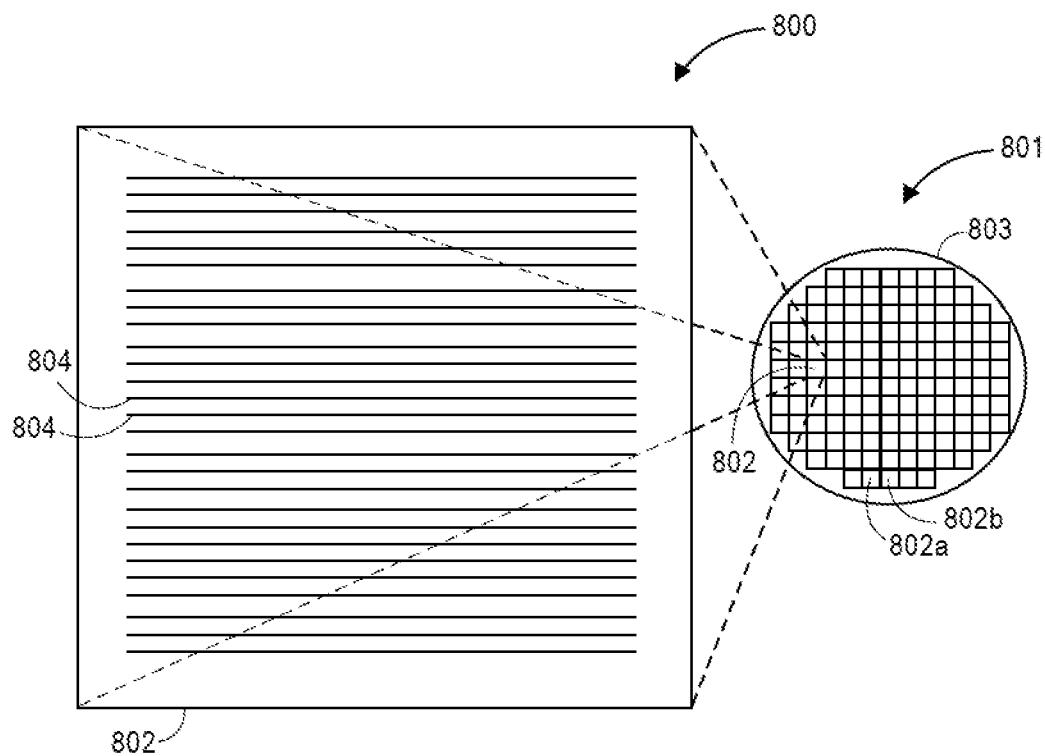
FIGS. 8A-8B schematically illustrate a top view of an example die in wafer form and in singulated form, and a cross section side view of a package assembly, in accordance with various embodiments.
Figure 8B:
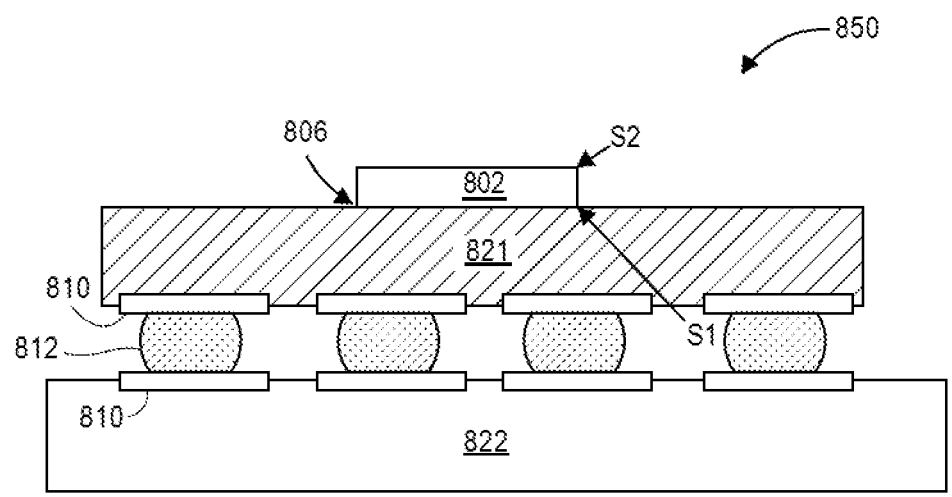

FIGS. 8A-8B schematically illustrate a top view of an example die in wafer form and in singulated form, and a cross section side view of a package assembly, in accordance with various embodiments. FIGS. 8A-8B schematically illustrate a top view of an example die in wafer form and in singulated form, and a cross section side view of a package assembly, in accordance with various embodiments. FIG. 8A schematically illustrates a top view of an example die 802 in a wafer form 801 and in a singulated form 800, in accordance with some embodiments. In some embodiments, die 802 may be one of a plurality of dies, e.g., dies 802, 802a, 802b, of a wafer 803 comprising semiconductor material, e.g., silicon or other suitable material. The plurality of dies, e.g., dies 802, 802a, 802b, may be formed on a surface of wafer 803. Each of the dies 802, 802a, 802b, may be a repeating unit of a semiconductor product that includes devices as described herein. For example, die 802 may include circuitry having elements such as capacitors and/or inductors 804 (e.g., fin structures, nanowires, and the like) that provide a channel pathway for mobile charge carriers in transistor devices. Although one or more capacitors and/or inductors 804 are depicted in rows that traverse a substantial portion of die 802, it is to be understood that one or more capacitors and/or inductors 804 may be configured in any of a wide variety of other suitable arrangements on die 802 in other embodiments.

After a fabrication process of the device embodied in the dies is complete, wafer 803 may undergo a singulation process in which each of dies, e.g., die 802, is separated from one another to provide discrete "chips" of the semiconductor product. Wafer 803 may be any of a variety of sizes. In some embodiments, wafer 803 has a diameter ranging from about 25.4 mm to about 450 mm. Wafer 803 may include other sizes and/or other shapes in other embodiments. According to various embodiments, the one or more capacitors and/or inductors 804 may be disposed on a semiconductor substrate in wafer form 801 or singulated form 800. One or more capacitors and/or inductors 804 described herein may be incorporated in die 802 for logic, memory, or combinations thereof. In some embodiments, one or more capacitors and/or inductors 804 may be part of a system-on-chip (SoC) assembly.

FIG. 8B schematically illustrates a cross-section side view of an integrated circuit (IC) assembly 850, in accordance with some embodiments. In some embodiments, IC assembly 850 may include one or more dies, e.g., die 802, electrically or physically coupled with a package substrate 821. Die 802 may include one or more capacitors and/or inductors 804 as described herein. In some embodiments, package substrate 821 may be electrically coupled with a circuit board 822 as is well known to a person of ordinary skill in the art. Die 802 may represent a discrete product made from a semiconductor material (e.g., silicon) using semiconductor fabrication techniques such as thin film deposition, lithography, etching, and the like. In some embodiments, die 802 may be, include, or be a part of a processor, memory, SoC or ASIC in some embodiments.

Die 802 can be attached to package substrate 821 according to a wide variety of suitable configurations including, for example, being directly coupled with package substrate 821 in a flip-chip configuration, as depicted. In the flip-chip configuration, an active side S1 of die 802 including circuitry is attached to a surface of package substrate 821 using hybrid bonding structures as described herein that may also electrically couple die 802 with package substrate 821. Active side S1 of die 802 may include multi-threshold voltage transistor devices as described herein. An inactive side S2 of die 802 may be disposed opposite to active side S1.

In some embodiments, package substrate 821 is an epoxy-based laminate substrate having a core and/or build-up layers such as, for example, an Ajinomoto Build-up Film (ABF) substrate. Package substrate 821 may include other suitable types of substrates in other embodiments including, for example, substrates formed from glass, ceramic, or semiconductor materials.

Package substrate 821 may include electrical routing features configured to route electrical signals to or from die 802. The electrical routing features may include pads or traces (not shown) disposed on one or more surfaces of package substrate 821 and/or internal routing features (not shown) such as trenches, vias, or other interconnect structures to route electrical signals through package substrate 821. In some embodiments, package substrate 821 may include electrical routing features such as pads (not shown) configured to receive the respective die-level interconnect structures 806 of die 802.

Circuit board 822 may be a printed circuit board (PCB) comprising an electrically insulative material such as an epoxy laminate. Circuit board 822 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Interconnect structures such as traces, trenches, vias may be formed through the electrically insulating layers to route the electrical signals of die 802 through circuit board 822. Circuit board 822 may comprise other suitable materials in other embodiments. In some embodiments, circuit board 822 is a motherboard as is well known to a person of ordinary skill in the art.

Package-level interconnects such as, for example, solder balls 812 may be coupled to one or more pads 810 on package substrate 821 and/or on circuit board 822 to form corresponding solder joints that are configured to further route the electrical signals between package substrate 821 and circuit board 822. Pads 810 may comprise any suitable electrically conductive material such as metal including, for example, nickel (Ni), palladium (Pd), gold (Au), silver (Ag), copper (Cu), and combinations thereof. Other suitable techniques to physically and/or electrically couple package substrate 821 with circuit board 822 may be used in other embodiments.

IC assembly 850 may include a wide variety of other suitable configurations in other embodiments including, for example, suitable combinations of flip-chip and/or wire-bonding configurations, interposers, multi-chip package configurations including system-in-package (SiP), and/or package-on-package (PoP) configurations. Other suitable techniques to route electrical signals between die 802 and other components of IC assembly 850 may be used in some embodiments.

A person of ordinary skill in the art should recognize that any known semiconductor device fabricated using any known semiconductor process that may benefit from the principles described herein.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 9:
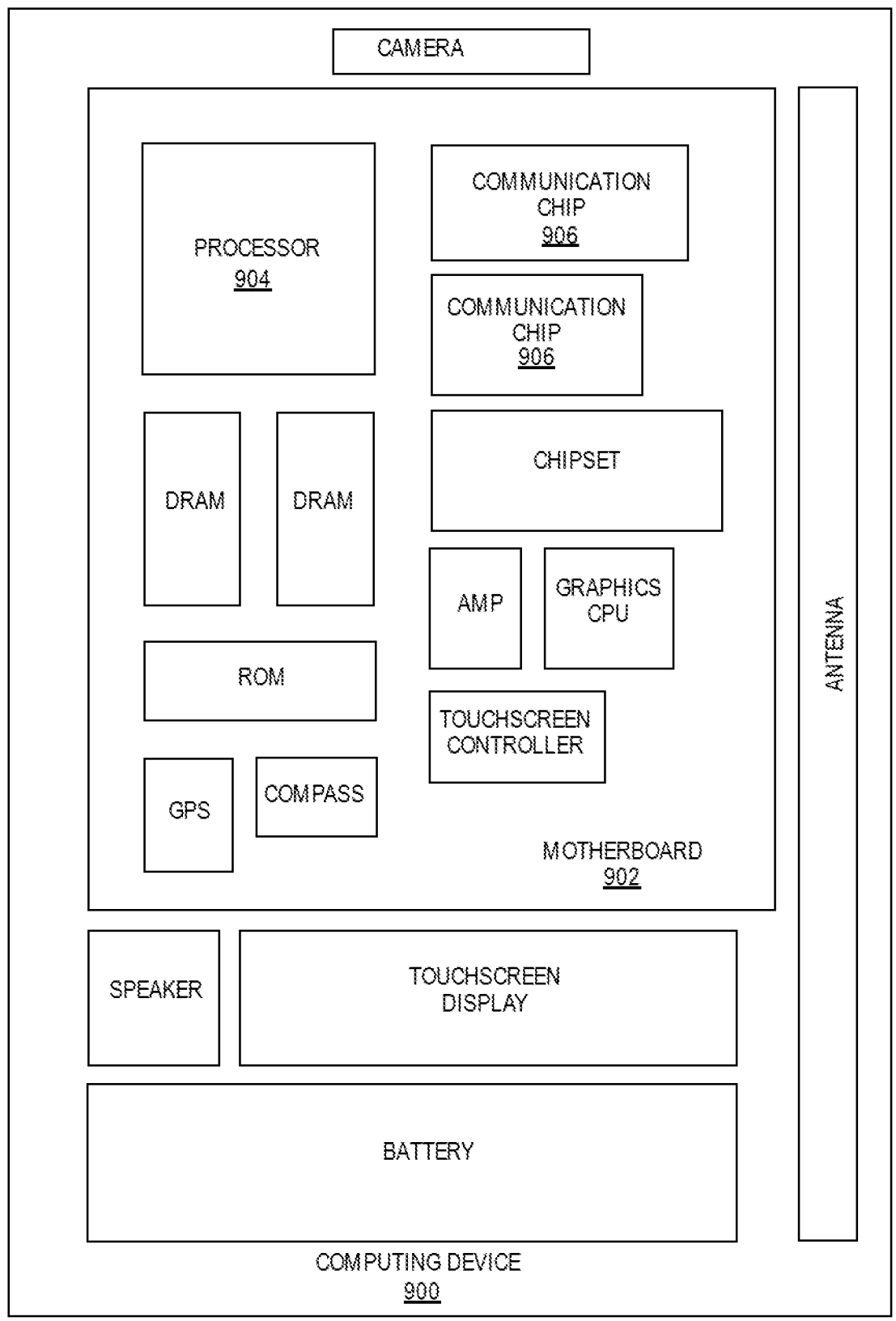
FIG. 9 illustrates a computing device in accordance with one implementation of the invention.

FIG. 9 illustrates a computing device 900 in accordance with one implementation of the invention. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of the invention, the integrated circuit die of the communication chip includes one or more devices, such as MOS-FET transistors built in accordance with implementations of the invention.

In further implementations, another component housed within the computing device 900 may contain an integrated circuit die that includes one or more devices, such as MOS-FET transistors built in accordance with implementations of the invention.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Figure 10:
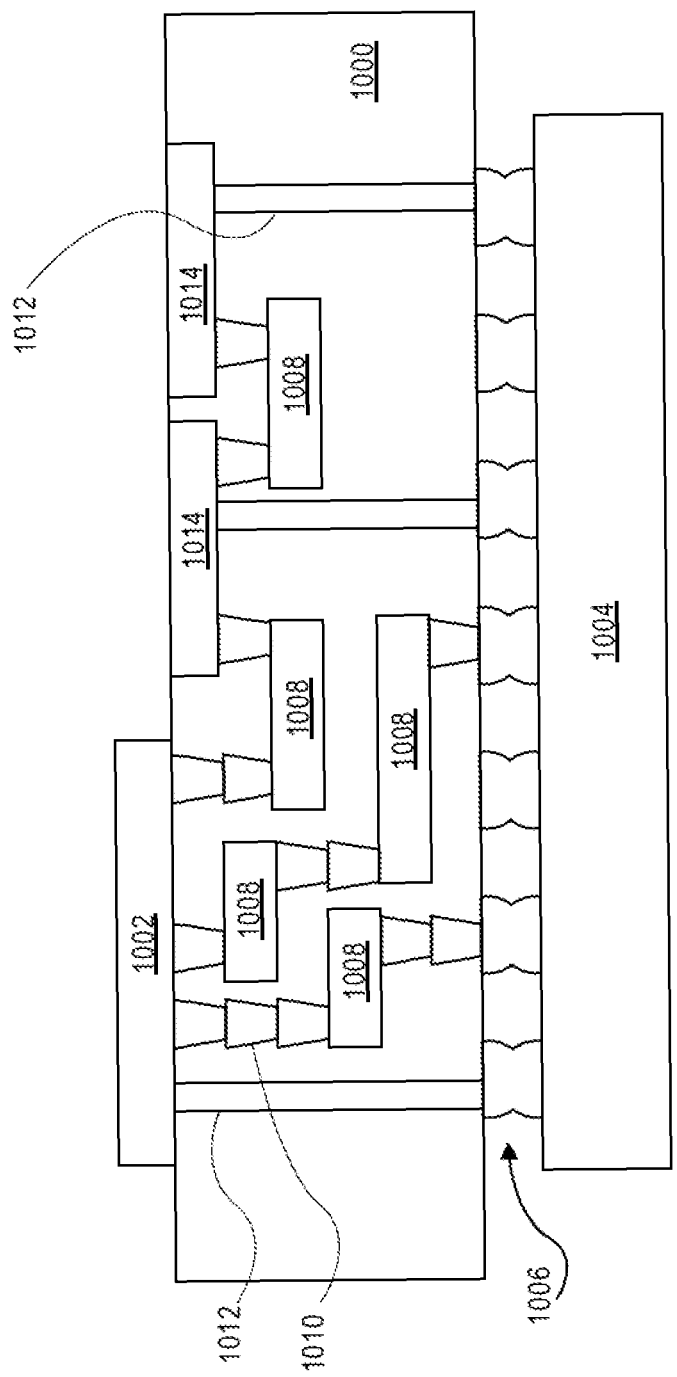
FIG. 10 illustrates an interposer that includes one or more embodiments of the invention.

FIG. 10 illustrates an interposer 1000 that includes one or more embodiments of the invention. The interposer 1000 is an intervening substrate used to bridge a first substrate 1002 to a second substrate 1004. The first substrate 1002 may be, for instance, an integrated circuit die. The second substrate 1004 may be, for instance, a memory module, a computer motherboard, or another integrated circuit die. Generally, the purpose of an interposer 1000 is to spread a connection to a wider pitch or to reroute a connection to a different connection. For example, an interposer 1000 may couple an integrated circuit die to a ball grid array (BGA) 1006 that can subsequently be coupled to the second substrate 1004. In some embodiments, the first and second substrates 1002/1004 are attached to opposing sides of the interposer 1000. In other embodiments, the first and second substrates 1002/1004 are attached to the same side of the interposer 1000. And in further embodiments, three or more substrates are interconnected by way of the interposer 1000.

The interposer 1000 may be formed of an epoxy resin, a fiberglass-reinforced epoxy resin, a ceramic material, or a polymer material such as polyimide. In further implementations, the interposer 1000 may be formed of alternate rigid or flexible materials that may include the same materials described above for use in a semiconductor substrate, such as silicon, germanium, and other group III-V and group IV materials.

The interposer 1000 may include metal interconnects 1008 and vias 1010, including but not limited to through-silicon vias (TSVs) 1012. The interposer 1000 may further include embedded devices 1014, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1000. In accordance with embodiments of the invention, apparatuses or processes disclosed herein may be used in the fabrication of interposer 1000.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

The following paragraphs describe examples of various embodiments.

EXAMPLES

Example 1 is a transistor comprising: a backside contact metal; a first epitaxial layer on a first backside contact metal, wherein the first backside contact metal is directly electrically coupled with the first epitaxial layer, and wherein the first epitaxial layer is part of an NMOS; a second epitaxial layer on a second backside contact metal, wherein the second backside contact metal is electrically coupled with the second epitaxial layer, and wherein the second epitaxial layer is part of a PMOS; and wherein the first backside contact metal is electrically coupled with a voltage ground (VSS), and wherein the second backside contact metal is electrically coupled with the SRAM VCC power supply (SVCC).

Example 2 includes the transistor of example 1, or of any other example or embodiment herein, wherein the second backside contact metal further includes: a third backside contact metal; and a fourth backside contact metal on the third backside contact metal and electrically coupled with the third backside contact metal, wherein the fourth backside contact metal is directly electrically coupled with the second epitaxial layer and provides a voltage to the second epitaxial layer during operation.

Example 3 includes the transistor of example 1, or of any other example or embodiment herein, wherein the first epitaxial layer or the second epitaxial layer includes a selected one or more of: one or more nanosheets, one or more nanowires, or one or more FinFET structures.

Example 4 includes the transistor of example 1, or of any other example or embodiment herein, wherein the SVCC includes a selected one of: a fixed voltage or a variable voltage.

Example 5 includes the transistor of example 1, or of any other example or embodiment herein, further comprising a metal zero layer on top of the epitaxial layer.

Example 6 includes the transistor of example 1, or of any other example or embodiment herein, wherein the transistor is a portion of a static random-access memory (SRAM) cell.

Example 7 includes the transistor of example 1, or of any other example or embodiment herein, wherein the transistor is a first transistor; and further comprising: a second transistor including: a third epitaxial layer on the second backside contact metal; and wherein the second backside contact metal is directly electrically coupled with the third epitaxial layer and provides a variable voltage to the third epitaxial layer during operation.

Example 8 includes the transistor of example 7, or of any other example or embodiment herein, wherein the third epitaxial layer is part of a PMOS.

Example 9 includes the transistor of example 1, or of any other example or embodiment herein, wherein the first backside contact metal or the second backside contact metal is on a substrate that includes silicon.

Example 10 is a transistor comprising: a first backside contact metal; a first epitaxial layer on the first backside contact metal, wherein the first epitaxial layer is part of a NMOS; a second backside contact metal; a second epitaxial layer on the second backside contact metal, wherein the second epitaxial layer is part of a PMOS; a metal layer on top of the second epitaxial layer and directly electrically coupled with the second epitaxial layer; and an electrical contact extending from the metal layer to the second backside contact metal and directly electrically couples the metal layer and the second backside contact metal.

Example 11 includes the transistor of example 10, or of any other example or embodiment herein, wherein the electrical contact is adjacent to a side of the second epitaxial layer.

Example 12 includes the transistor of example 10, or of any other example or embodiment herein, wherein the electrical contact includes a via filled with an electrically conductive material.

Example 13 includes the transistor of example 12, or of any other example or embodiment herein, wherein the electrically conductive material includes a metal.

Example 14 includes the transistor of example 10, or of any other example or embodiment herein, wherein the first epitaxial layer or the second epitaxial layer includes a selected one or more of: one or more nanosheets, one or more nanowires, or one or more FinFET structures.

Example 15 includes the transistor of example 10, or of any other example or embodiment herein, wherein the second backside contact metal is electrically coupled with a SVCC.

Example 16 includes the transistor of example 10, or of any other example or embodiment herein, further comprising a metal zero layer on top of the second epitaxial layer.

Example 17 includes the transistor of example 10, or of any other example or embodiment herein, wherein the transistor is a portion of a static random-access memory (SRAM) cell.

Example 18 includes the transistor of example 10, or of any other example or embodiment herein, wherein the second epitaxial layer includes a third epitaxial layer and a fourth epitaxial layer, the third epitaxial layer and the fourth epitaxial layer adjacent to each other and each on the second backside contact metal; and wherein the metal layer is on top of and directly electrically coupled with the third epitaxial layer and the fourth epitaxial layer.

Example 19 includes the transistor of example 18, or of any other example or embodiment herein, wherein the electrical contact is adjacent to a side of the third epitaxial layer and the fourth epitaxial layer.

Example 20 includes the transistor of example 10, or of any other example or embodiment herein, further comprising an electrical insulation layer between the second backside contact metal and the second epitaxial layer.

Example 21 includes the transistor of example 10, or of any other example or embodiment herein, wherein the second backside contact metal is on a substrate that includes silicon.

Example 22 is a memory cell comprising: a plurality of transistors, at least one of the transistors includes: a first backside contact metal; a second backside contact metal on the first backside contact metal and electrically coupled with the first backside contact metal; an epitaxial layer on and directly electrically coupled to the second backside contact metal, wherein the epitaxial layer is a portion of a PMOS; and wherein the backside contact metal provides a variable voltage to the epitaxial layer during operation.

Example 23 includes the memory cell of example 22, or of any other example or embodiment herein, wherein the epitaxial layer includes a selected one or more of: one or more nanosheets, one or more nanowires, or one or more FinFET structures.

Example 24 includes the memory cell of example 22, or of any other example or embodiment herein, wherein the backside contact metal is electrically coupled with a SVCC.

Example 25 includes the memory cell of example 22, or of any other example or embodiment herein, wherein the memory cell is a first memory cell, the plurality of transistors is a first plurality of transistors the epitaxial layer is a first epitaxial layer; and further comprising: a second memory cell that includes a second plurality of transistors, at least one of the second plurality of transistors includes: a second epitaxial layer on and directly electrically coupled to the second backside contact metal; and wherein the backside contact metal provides a variable voltage to the second epitaxial layer during operation.

Example 26 is a method comprising: providing a backside contact metal; forming a first epitaxial layer and a second epitaxial layer on the backside contact metal, wherein the first epitaxial layer and the second epitaxial layer are a portion of a PMOS; forming a metal layer on the first epitaxial layer and on the second epitaxial layer; forming a via between the first epitaxial layer and a second epitaxial layer, the via extending from the metal layer to the backside contact metal; and filling the via with a material that is electrically conductive.

Example 27 may include the method of example 26, or of any other example or embodiment herein, wherein forming a via further includes drilling the via using a selected one of: a laser drill or a mechanical drill.

Example 28 may include the method of example 26, or of any other example or embodiment herein, wherein the conductive material includes a metal.

Example 29 may include the method of example 26, or of any other example or embodiment herein, wherein the first epitaxial layer and the second epitaxial layer include a selected one or more of: one or more nanosheets, one or more nanowires, or one or more FinFET structures.

Example 30 may include the method of example 26, or of any other example or embodiment herein, wherein providing the backside contact metal further includes providing the backside contact metal on a silicon substrate.

Example 31 is a method comprising: providing a backside contact metal; forming a metal layer on the backside contact metal, wherein the metal layer is electrically coupled with the backside contact metal; and forming an epitaxial layer on the metal layer, wherein a side of the epitaxial layer is electrically coupled with the metal layer.

Example 32 may include the method of example 31, or of any other example or embodiment herein, wherein the backside contact metal is a backside metal zero (BM0) layer.

Example 33 may include the method of example 31, or of any other example or embodiment herein, wherein the metal layer includes a plurality of metal layers.

Example 34 may include the method of example 33, or of any other example or embodiment herein, wherein the plurality of metal layers include a dielectric material between two of the plurality of metal layers.

Example 35 may include the method of example 31, or of any other example or embodiment herein, wherein the epitaxial layer includes a selected one or more of: one or more nanosheets, one or more nanowires, or one or more FinFET structures.

What is claimed is:

1. A transistor comprising:
   a backside contact metal;
   a first epitaxial layer on a first backside contact metal, wherein the first backside contact metal is directly electrically coupled with the first epitaxial layer, and wherein the first epitaxial layer is part of an NMOS;
   a second epitaxial layer on a second backside contact metal, wherein the second backside contact metal is electrically coupled with the second epitaxial layer, and wherein the second epitaxial layer is part of a PMOS; and
   wherein the first backside contact metal is electrically coupled with a voltage ground (VSS), and wherein the second backside contact metal is electrically coupled with the SRAM VCC power supply (SVCC).

2. The transistor of claim 1, wherein the second backside contact metal further includes:
   a third backside contact metal; and
   a fourth backside contact metal on the third backside contact metal and electrically coupled with the third backside contact metal, wherein the fourth backside contact metal is directly electrically coupled with the second epitaxial layer and provides a voltage to the second epitaxial layer during operation.

3. The transistor of claim 1, wherein the first epitaxial layer or the second epitaxial layer includes a selected one or more of: one or more nanosheets, one or more nanowires, or one or more FinFET structures.

4. The transistor of claim 1, wherein the SVCC includes a selected one of: a fixed voltage or a variable voltage.

5. The transistor of claim 1, further comprising a metal zero layer on top of the epitaxial layer.

6. The transistor of claim 1, wherein the transistor is a portion of a static random-access memory (SRAM) cell.

7. The transistor of claim 1, wherein the transistor is a first transistor; and further comprising:
   a second transistor including:
      a third epitaxial layer on the second backside contact metal; and
      wherein the second backside contact metal is directly electrically coupled with the third epitaxial layer and provides a variable voltage to the third epitaxial layer during operation.

8. The transistor of claim 7, wherein the third epitaxial layer is part of a PMOS.

9. The transistor of claim 1, wherein the first backside contact metal or the second backside contact metal is on a substrate that includes silicon.

10. A transistor comprising:
    a first backside contact metal;
    a first epitaxial layer on the first backside contact metal, wherein the first epitaxial layer is part of a NMOS;
    a second backside contact metal;
    a second epitaxial layer on the second backside contact metal, wherein the second epitaxial layer is part of a PMOS;
    a metal layer on top of the second epitaxial layer and directly electrically coupled with the second epitaxial layer; and
    an electrical contact extending from the metal layer to the second backside contact metal and directly electrically couples the metal layer and the second backside contact metal.

11. The transistor of claim 10, wherein the electrical contact is adjacent to a side of the second epitaxial layer.

12. The transistor of claim 10, wherein the electrical contact includes a via filled with an electrically conductive material.

13. The transistor of claim 12, wherein the electrically conductive material includes a metal.

14. The transistor of claim 10, wherein the first epitaxial layer or the second epitaxial layer includes a selected one or more of: one or more nanosheets, one or more nanowires, or one or more FinFET structures.

15. The transistor of claim 10, wherein the second backside contact metal is electrically coupled with a SVCC.

16. The transistor of claim 10, further comprising a metal zero layer on top of the second epitaxial layer.

17. The transistor of claim 10, wherein the transistor is a portion of a static random-access memory (SRAM) cell.

18. The transistor of claim 10, wherein the second epitaxial layer includes a third epitaxial layer and a fourth epitaxial layer, the third epitaxial layer and the fourth epitaxial layer adjacent to each other and each on the second backside contact metal; and
wherein the metal layer is on top of and directly electrically coupled with the third epitaxial layer and the fourth epitaxial layer.

19. The transistor of claim 18, wherein the electrical contact is adjacent to a side of the third epitaxial layer and the fourth epitaxial layer.

20. The transistor of claim 10, further comprising an electrical insulation layer between the second backside contact metal and the second epitaxial layer.

21. The transistor of claim 10, wherein the second backside contact metal is on a substrate that includes silicon.

22. A memory cell comprising:
a plurality of transistors, at least one of the transistors includes:
a first backside contact metal;
a second backside contact metal on the first backside contact metal and electrically coupled with the first backside contact metal;
an epitaxial layer on and directly electrically coupled to the second backside contact metal, wherein the epitaxial layer is a portion of a PMOS;
wherein the first backside contact metal and the second backside contact metal are located between the epitaxial layer and a backside metal zero (BM0) layer; and
wherein the backside contact metal provides a variable voltage to the epitaxial layer during operation.

23. The memory cell of claim 22, wherein the epitaxial layer includes a selected one or more of: one or more nanosheets, one or more nanowires, or one or more FinFET structures.

24. The memory cell of claim 22, wherein the first backside contact metal or the second backside contact metal is electrically coupled with a SVCC.

25. The memory cell of claim 22, wherein the memory cell is a first memory cell, the plurality of transistors is a first plurality of transistors the epitaxial layer is a first epitaxial layer; and further comprising:
a second memory cell that includes a second plurality of transistors, at least one of the second plurality of transistors includes:
a second epitaxial layer on and directly electrically coupled to the second backside contact metal; and
wherein the backside contact metal provides a variable voltage to the second epitaxial layer during operation.

* * * * *